(12) United States Patent
Matsuzawa et al.

(10) Patent No.: US 7,078,074 B2
(45) Date of Patent: Jul. 18, 2006

(54) LENS PLASMA COATING SYSTEM

(75) Inventors: Yasuo Matsuzawa, Roswell, GA (US); Lynn Cook Winterton, Alpharetta, GA (US)

(73) Assignee: Novartis AG, Basel (CH)

( * ) Notice: Subject to any disclaimer, the term of this patent is extended or adjusted under 35 U.S.C. 154(b) by 0 days.

(21) Appl. No.: 11/065,113

(22) Filed: Feb. 23, 2005

(65) Prior Publication Data

US 2005/0142287 A1    Jun. 30, 2005

Related U.S. Application Data

(62) Division of application No. 09/911,221, filed on Jul. 23, 2001, now Pat. No. 6,881,269.

(60) Provisional application No. 60/225,940, filed on Aug. 17, 2000.

(51) Int. Cl.
  B05D 5/06   (2006.01)
  H05H 1/24   (2006.01)

(52) U.S. Cl. .................... 427/166; 427/569; 427/570; 118/719; 118/723 R

(58) Field of Classification Search .............. 427/569, 427/570, 165, 166, 164, 167; 118/719, 723 R
See application file for complete search history.

(56) References Cited

U.S. PATENT DOCUMENTS

| 2,936,222 | A | 5/1960 | Stevens | 23/292 |
|---|---|---|---|---|
| 3,008,920 | A | 11/1961 | Urchick | 260/45.5 |
| 3,070,573 | A | 12/1962 | Beck | 260/45.5 |
| 3,854,982 | A | 12/1974 | Aelion et al. | 117/68 |
| 4,032,440 | A | 6/1977 | Yasuda | 210/23 H |
| 4,137,550 | A | 1/1979 | Kaganowicz et al. | 358/128 |
| 4,311,573 | A | 1/1982 | Mayhan et al. | 204/159 |
| 4,312,575 | A | 1/1982 | Peyman et al. | 351/160 |
| 4,468,229 | A | 8/1984 | Su | 8/507 |
| 4,501,805 | A | 2/1985 | Yasuda et al. | 429/174 |
| 4,503,133 | A | 3/1985 | van Lier et al. | 429/174 |
| 4,553,975 | A | 11/1985 | Su | 8/507 |
| 4,559,059 | A | 12/1985 | Su | 9/507 |
| 4,589,964 | A | 5/1986 | Mayhan et al. | 522/85 |
| 4,632,844 | A * | 12/1986 | Yanagihara et al. | 427/488 |
| 4,664,936 | A | 5/1987 | Ueno et al. | 427/38 |
| 4,692,347 | A | 9/1987 | Yasuda | 427/40 |
| 4,749,457 | A | 6/1988 | Yasuda et al. | 204/150 |
| 4,752,426 | A | 6/1988 | Cho | 264/22 |
| 4,761,436 | A | 8/1988 | Kohno et al. | 522/114 |
| 4,948,485 | A | 8/1990 | Wallsten et al. | 204/164 |
| 4,968,532 | A | 11/1990 | Janssen et al. | 427/164 |
| 4,980,196 | A | 12/1990 | Yasuda et al. | 427/38 |
| 4,994,298 | A | 2/1991 | Yasuda | 427/41 |

(Continued)

FOREIGN PATENT DOCUMENTS

DE    34 15012    1/1986

(Continued)

*Primary Examiner*—Timothy Meeks
*Assistant Examiner*—David Turocy

(57) ABSTRACT

The invention provides a method for plasma coating of optical lenses, particularly lenses made of silicone-containing polymer. The method of the invention comprising selectively depressurizing and pressurizing an entry hold chamber and an exit hold chamber while constantly maintaining a plasma gas in a coating chamber at a process pressure without depressurizing and pressurizing repeatedly the coating chamber, wherein the coating chamber is located between the entry hold chamber and the exit hold chamber.

12 Claims, 7 Drawing Sheets

U.S. PATENT DOCUMENTS

| | | |
|---|---|---|
| 5,176,938 A | 1/1993 | Wallsten et al. ............ 427/447 |
| 5,182,000 A | 1/1993 | Antonelli et al. ........ 204/181.1 |
| 5,267,390 A | 12/1993 | Yang et al. ................ 29/527.4 |
| 5,270,082 A | 12/1993 | Lin et al. .................... 427/539 |
| 5,278,384 A | 1/1994 | Matsuzawa et al. ... 219/121.36 |
| 5,312,529 A | 5/1994 | Antonelli et al. ........ 204/181.1 |
| 5,340,454 A * | 8/1994 | Schaefer et al. ....... 204/192.12 |
| 5,597,609 A * | 1/1997 | Beisswenger et al. ......... 427/8 |
| 5,759,334 A | 6/1998 | Kojima et al. .............. 156/345 |
| 5,805,264 A | 9/1998 | Janssen et al. .............. 351/160 |
| 5,874,127 A | 2/1999 | Winterton et al. .......... 427/164 |

FOREIGN PATENT DOCUMENTS

| | | |
|---|---|---|
| DE | 3415012 A * | 1/1986 |
| DE | 19808163 C1 * | 7/1999 |

* cited by examiner

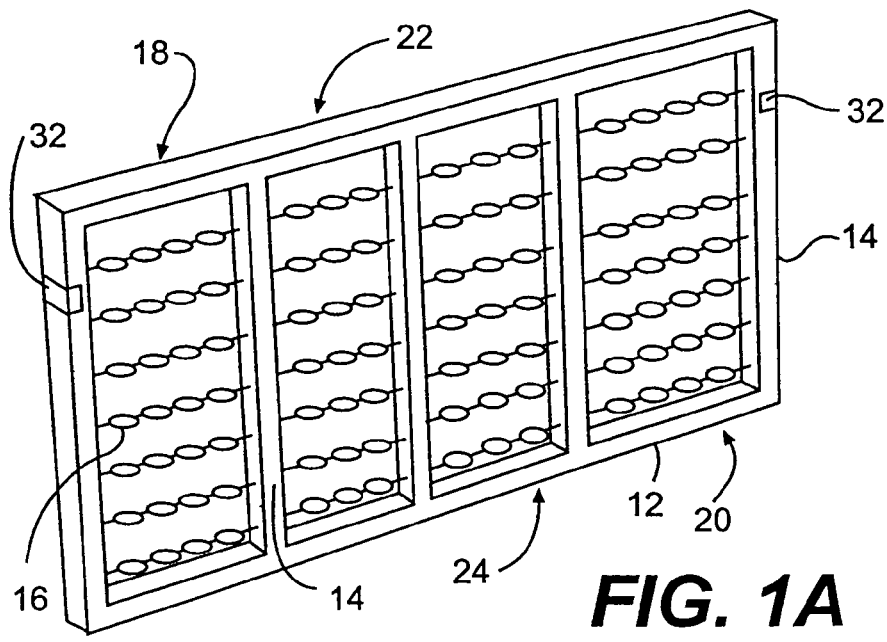
FIG. 1A
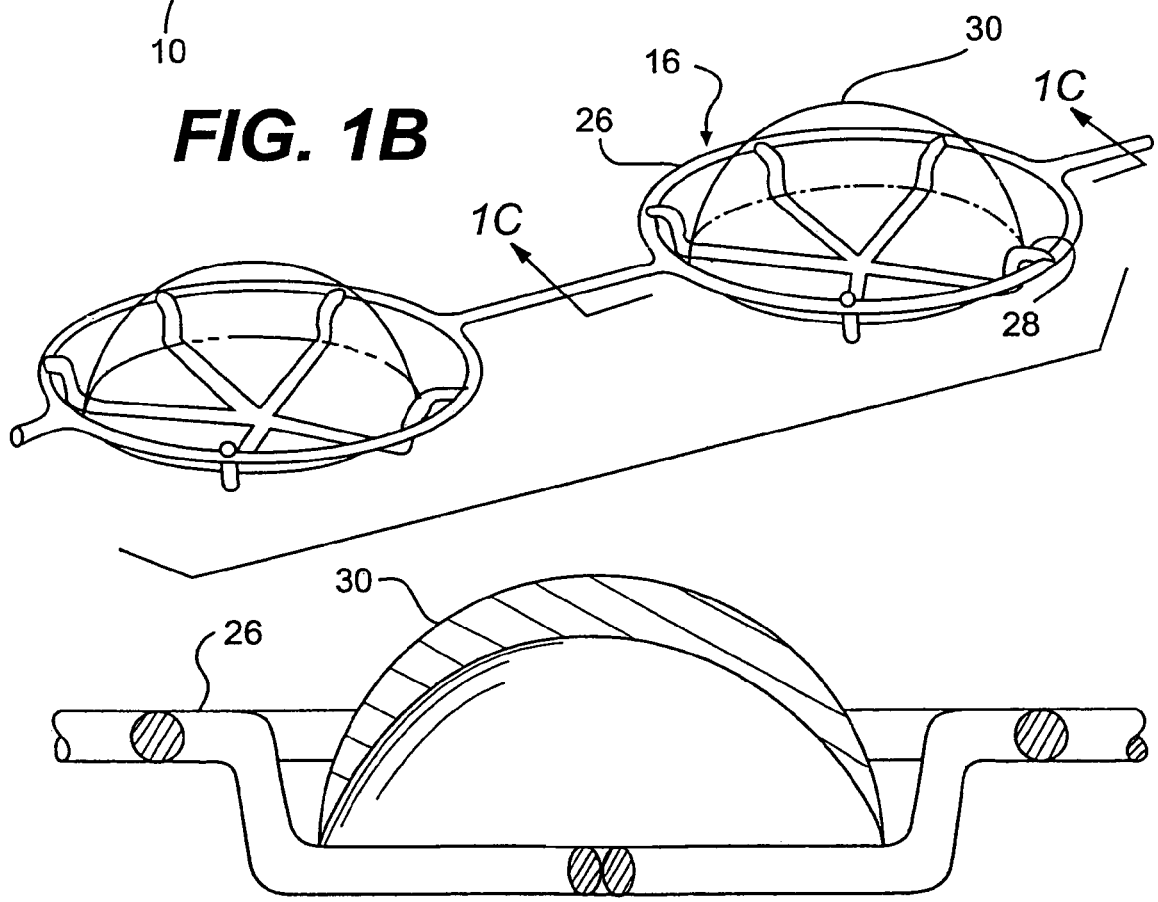
FIG. 1B
FIG. 1C

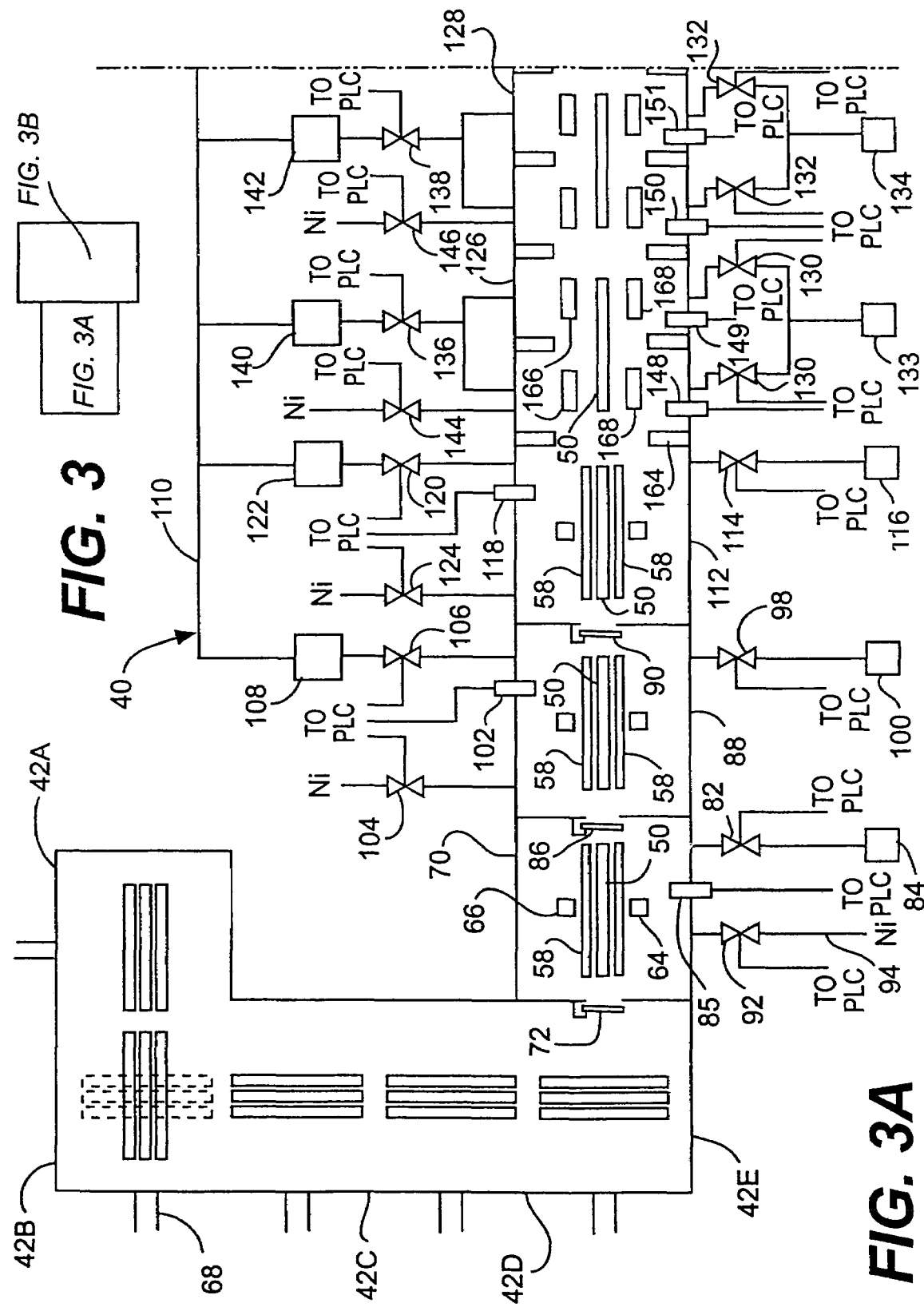

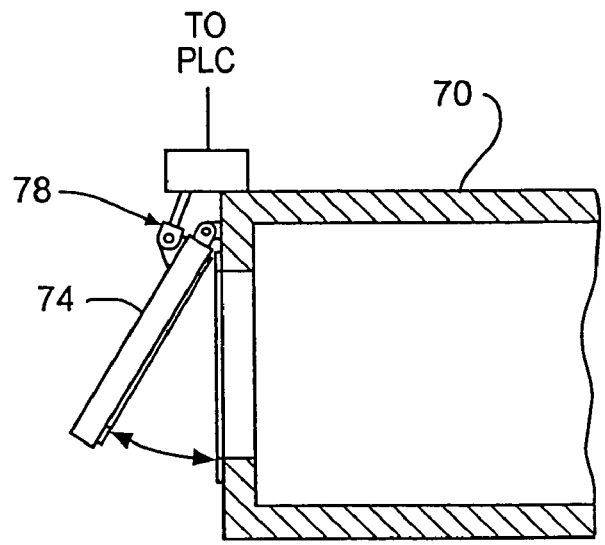
FIG. 5B
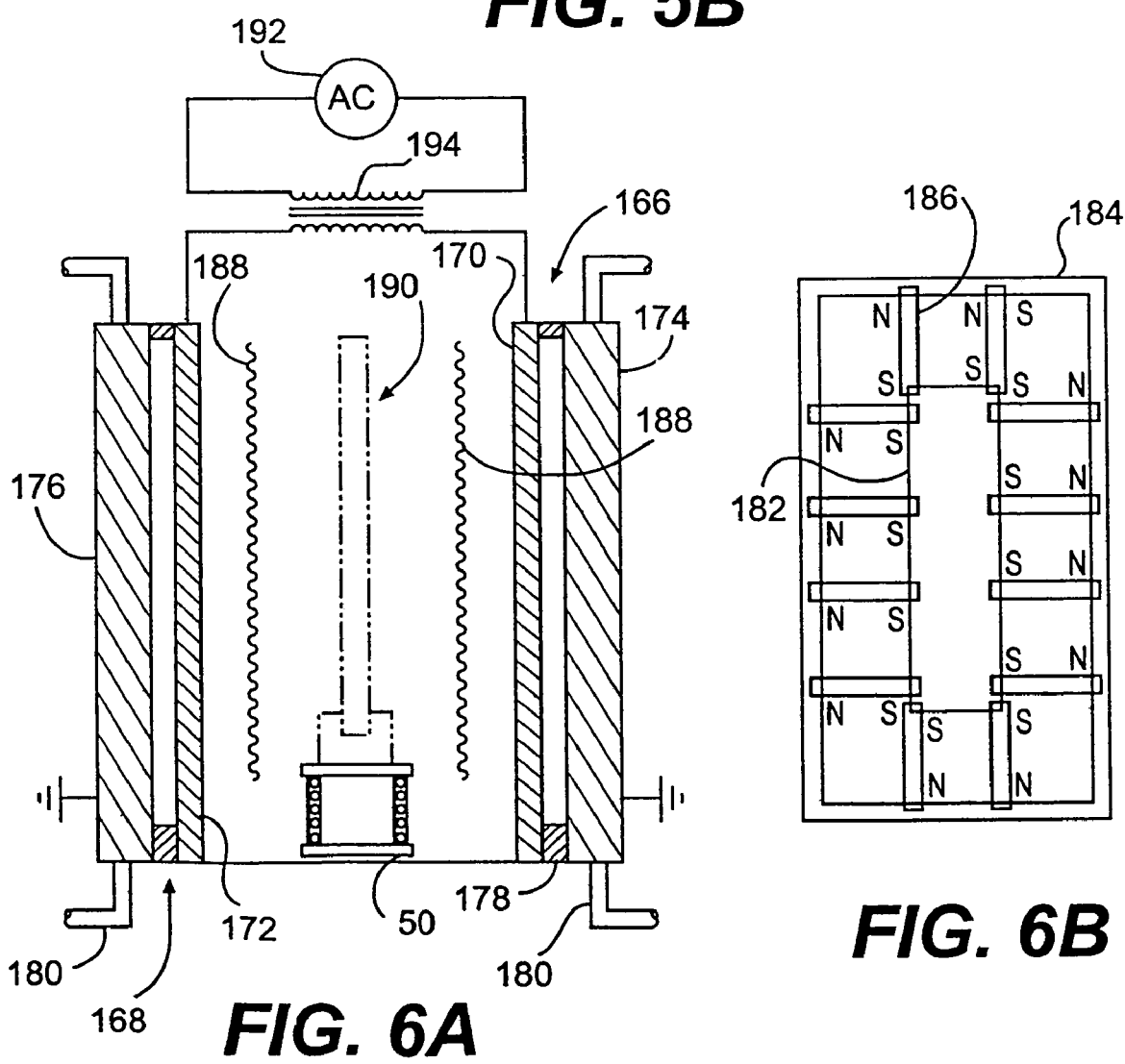
FIG. 6A
FIG. 6B

LENS PLASMA COATING SYSTEM

This application is a division of U.S. patent application Ser. No. 09/911,221 filed Jul. 23, 2001, now U.S. Pat. No. 6,881,269, which claims benefits under 35 U.S.C. §119(e) of U.S. provisional patent application No. 60/225,940 filed Aug. 17, 2000.

BACKGROUND OF THE INVENTION

The present invention relates to a system for coating contact lenses, or other optical lens devices, particularly those made of silicone-containing polymer. Hereinafter the term silicone polymers are used to indicate silicone-containing polymers suitable for ocular uses, including rigid silicone polymers, silicone elastomers and silicone hydrogels. The advantages of silicone polymers as contact lens materials have long been recognized. However, silicone polymers have several disadvantages. For example, certain materials in the eye's tear film tend to adhere to the lenses and reduce their optical clarity. The silicone lens, especially silicone elastomer or hydrogel lens, may be tacky and this characteristic may render the lens to stick to the cornea, and the material's hydrophobic nature prevents the lens from wetting.

To resolve these problems, it is known to apply a very thin hydrophilic coating using electrical glow discharge polymerization. Generally, the coating process involves placing a silicone lens core in, or moving it through, a plasma cloud so that the material adheres to the core. Although various materials may be used, hydrocarbons such as methane may be used.

The polymerized coating provides a highly wettable surface without significantly, if at all, reducing the oxygen and carbon dioxide permeability of the lens. It also provides an effective barrier against tear film material that would otherwise adhere to the lens, thereby preventing the optical clarity degradation that would otherwise occur.

Conventional plasma polymerization lens coating techniques employ batch systems in which one or more silicone lens cores are placed in a reactor chamber between opposing electrodes. The chamber is then sealed and depressurized by a vacuum system. Significant time is required to pump the batch system to the operative pressure. When a suitable pressure is achieved in the chamber, a process gas is introduced into the chamber interior, and the electrodes are energized. The resulting plasma cloud may apply a thin polymer coating to the lens. After an appropriate time, the electrodes are de-energized, and the reactor chamber is brought back to atmospheric pressure so that the lenses may be removed.

It has been recognized that it is preferable to move the lenses through the plasma cloud. Thus, in certain systems, the silicone lens cores are mounted on a rotating wheel disposed between the electrodes so that the wheel carries the lenses through the cloud. These systems are sometimes described as "continuous" systems to distinguish them from other batch systems. However, all such systems are considered to be batch systems for purposes of the present disclosure in that each requires a reactor chamber that must be repeatedly pressurized and depressurized as one or more groups of silicone lens cores are placed in and removed from the system.

One example of a batch system is provided in U.S. Pat. No. 4,312,575 to Peyman et al., the disclosure of which is incorporated by reference herein for all purposes. In "Ultrathin Coating Of Plasma Polymer Of Methane Applied On The Surface Of Silicone Contact Lenses," Journal of Biomedical Materials Research, Vol. 22, 919–937 (1988), Peng Ho and Yasuda describe a batch system including a bell-shaped vacuum chamber in which opposing aluminum electrodes are disposed. A rotatable aluminum plate sits between the electrodes and is driven by an induction motor within the system.

SUMMARY OF THE INVENTION

The present invention recognizes and addresses disadvantages of prior art constructions and methods.

Accordingly, it is an object of the present invention to provide an improved lens plasma coating system.

This and other objects are achieved by a system for treating the surface of an optical lens. The system includes an entry chamber having a first entrance gate and a first exit gate. The first entrance gate and the first exit gate seal the entry chamber when the gates are closed. The entry chamber includes a conveyor extending between the first entrance gate and the first exit gate. A first negative pressure source is in selective communication with the entry chamber. A coating chamber has a second entrance gate and a second exit gate. The second entrance gate and the second exit gate seal the coating chamber when they are closed. The coating chamber includes a pair of spaced apart electrodes disposed therein and a conveyor extending between the second entrance gate and the second exit gate so that the conveyor conveys the lens between the electrodes. A source of plasma gas is in communication with the coating chamber to introduce the gas into the coating chamber. A second negative pressure source is in communication with the coating chamber. An electrical power source is in communication with the electrodes to apply a predetermined electrical potential at each electrode so that, upon establishment of a predetermined pressure in the coating chamber by the second negative pressure source, a plasma cloud of the gas is established between the electrodes. An exit chamber has a third entrance gate and a third exit gate. The third entrance gate and the third exit gate seal the exit chamber when they are closed, and the exit chamber includes a conveyor extending between the third entrance gate and the third exit gate. A third negative pressure source is in selective communication with the exit chamber. The entry chamber communicates with the coating chamber through the first exit gate and the second entrance gate so that the entry chamber conveyor and the coating chamber conveyor communicate to pass the lens from the entry chamber to the coating chamber. The coating chamber communicates with the exit chamber through the second exit gate and the third entrance gate so that the coating chamber conveyor and the exit chamber conveyor communicate to pass the lens from the coating chamber to the exit chamber.

A method for treating the surface of an optical lens according to the present invention includes providing first an optical lens and providing a coating chamber including a pair of spaced apart electrodes disposed therein. A plasma gas is maintained in the coating chamber. A first predetermined pressure is maintained in the coating chamber, and a predetermined electric potential is maintained at each electrode so that a plasma cloud of gas is established between the electrodes. An entry chamber is provided upstream from the coating chamber, and the first lens is moved into the entry chamber. Gas is introduced into at least a portion of the entry chamber adjacent the coating chamber, and at least that portion of the entry chamber is brought to the first predetermined pressure. The entry chamber is brought into communication with the coating chamber, and the first lens is moved from the entry chamber into the coating chamber and through the plasma cloud. An exit chamber is provided downstream from the coating chamber. Gas is introduced into at least a portion of the exit chamber adjacent the coating chamber, and at least that portion of the exit chamber is brought to the first predetermined pressure. The first lens is moved from the coating chamber to the exit chamber.

The accompanying drawings, which are incorporated in and constitute a part of this specification, illustrate one or more embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended drawings, in which:

FIG. 1A is a perspective view of a lens holding tray for use in a lens coating system and method according to an embodiment of the present invention;

FIG. 1B is an enlarged perspective view of the holding tray as in FIG. 1A;

FIG. 1C is a cross-sectional view taken along the line 1C—1C in FIG. 1B;

FIG. 5B is a cross-sectional view of a chamber and valve as shown in FIG. 5A;

FIG. 6A is a cross-sectional view of a lens coating system according to an embodiment of the present invention; and FIG. 6B is a plan view of the interior magnetic arrangement of a magnetic device for use in a coating chamber of a lens coating system according to an embodiment of the present invention.

Figure 2:
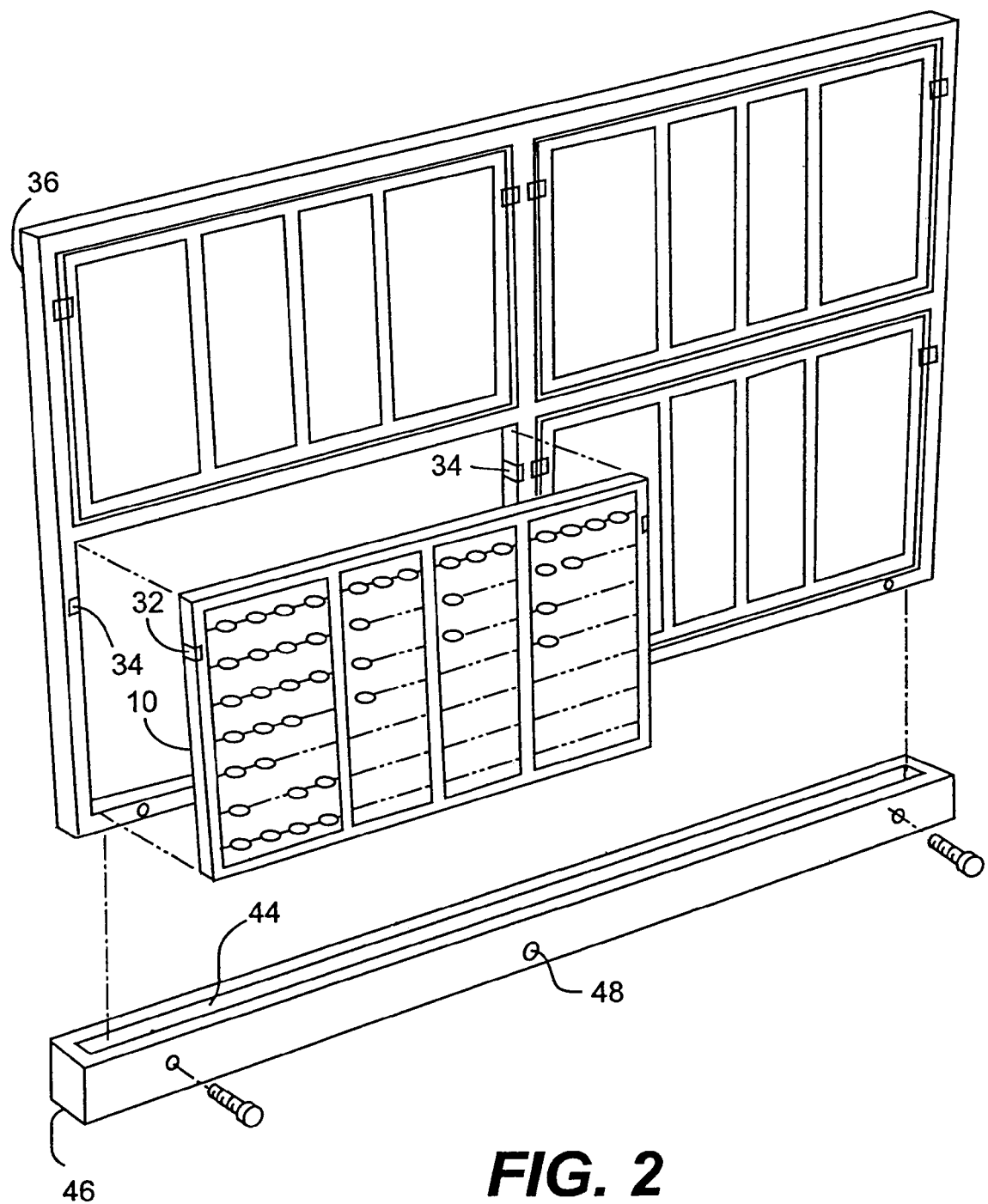
FIG. 2 is a perspective view of a lens tray carrier and a slug (i.e. carrier holding system) for use in a lens coating system and method according to an embodiment of the present invention.

Repeat use of reference characters in the present specification and drawings is intended to represent same or analogous features or elements of the invention.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

The present invention is directed to an optical lens coating system in which lens cores may enter, pass through and exit the system without requiring the coating zone to be repeatedly pressurized and depressurized. Although the discussion herein describes the use of a methane containing plasma cloud to apply a hydrophilic polymer coating to silicone lens cores, it should be understood that this is for exemplary purposes only and that other plasma and lens materials may be used. For example, the system may employ any suitable plasma, whether generated of hydrocarbon or other appropriate material, that would apply a desirable coating on a lens core. Additionally, the plasma may be comprised of an oxidizing gas so that the lens core surface is oxidized to create a hydrophilic layer. As used herein, a "coating" includes such a layer. Further, the system may be used in conjunction with lens cores made of any material upon which it is desirable to place a coating. Thus, it should be understood by those skilled in this art that the description of silicone lens cores and methane plasma herein is not intended to limit the scope or spirit of the present invention.

Furthermore the system may use any suitable apparatus and method for generating plasma to treat lens cores. Such apparatus and methods should be understood by those skilled in the art and are therefore not discussed in detail herein. Thus, it should also be understood that the particular arrangement described below for generating plasma is provided for exemplary purposes only.

Prior to entering the system, referring now to FIG. 1A, the lens cores are placed in a holding tray 10 having an outer frame 12 and vertical intermediate members 14. FIG. 1A illustrates an exemplary holding tray. Seven rows of wire holders 16 extend between each adjacent vertical member. In the two outer columns 18 and 20, each row contains four holders, while each row in the two inner columns 22 and 24 includes three holders. Thus, the tray includes ninety-eight holders in all.

Referring to FIGS. 1B and 1C, each holder 16 includes an annular wire rim 26 and five wire stems 28 extending radially inward therefrom. A lens core 30 is placed in each holder so that it sits on the stems 28. Holder 16 is described in more detail in commonly-assigned U.S. Pat. No. 5,874,127, the entire disclosure of which is incorporated by reference herein.

Referring again to FIG. 1A, and also referring to FIG. 2, each holding tray 10 includes a pair of hooks 32 on the opposing outer vertical members 14 of frame 12. Corresponding hooks 34 on a tray carrier 36 receive hooks 32 so that holding tray 10 may be hung on the tray carrier. In the embodiment shown in FIG. 2, carrier 36 may hold four holding trays 10 and, therefore, up to three hundred ninety two lens cores.

Figure 3B:
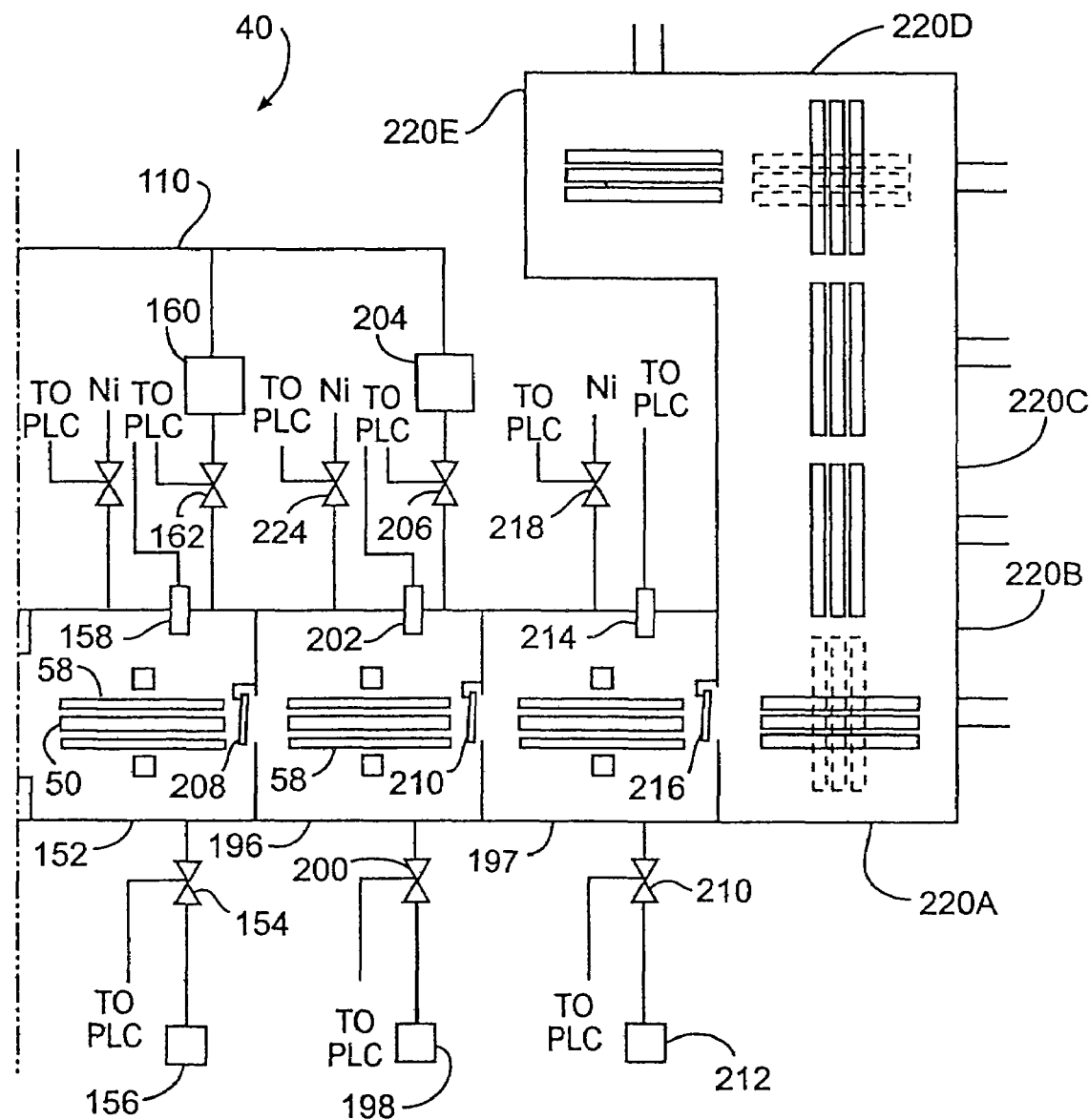
FIG. 3, presented on separate drawing sheets as FIGS. 3A and 3B, is a schematic illustration of a lens coating system according to an embodiment of the present invention.

Referring now to FIGS. 3A and 3B, the tray carrier is placed into a linear plasma coating system 40. Initially, the trays move through a drying chamber comprised of five subchambers (hereinafter referred to as "zones") 42A–42E, each approximately five meters long. The tray carrier remains for a total of about twenty minutes in the drying chamber for a desired time, say about twenty minutes or sufficient to meet the necessary vacuum and coating application target.

Because the lens cores may contain a hydrophilic material, they can be hygroscopic and therefore can absorb water from the environment. Thus, it may be desirable to allow drying time. The dry zones maintain a constant relative humidity level, e.g., at or below ten percent to permit further drying, and also provide a dry buffer area in which to place lens cores prior to entering the coating zones.

Figure 4A:
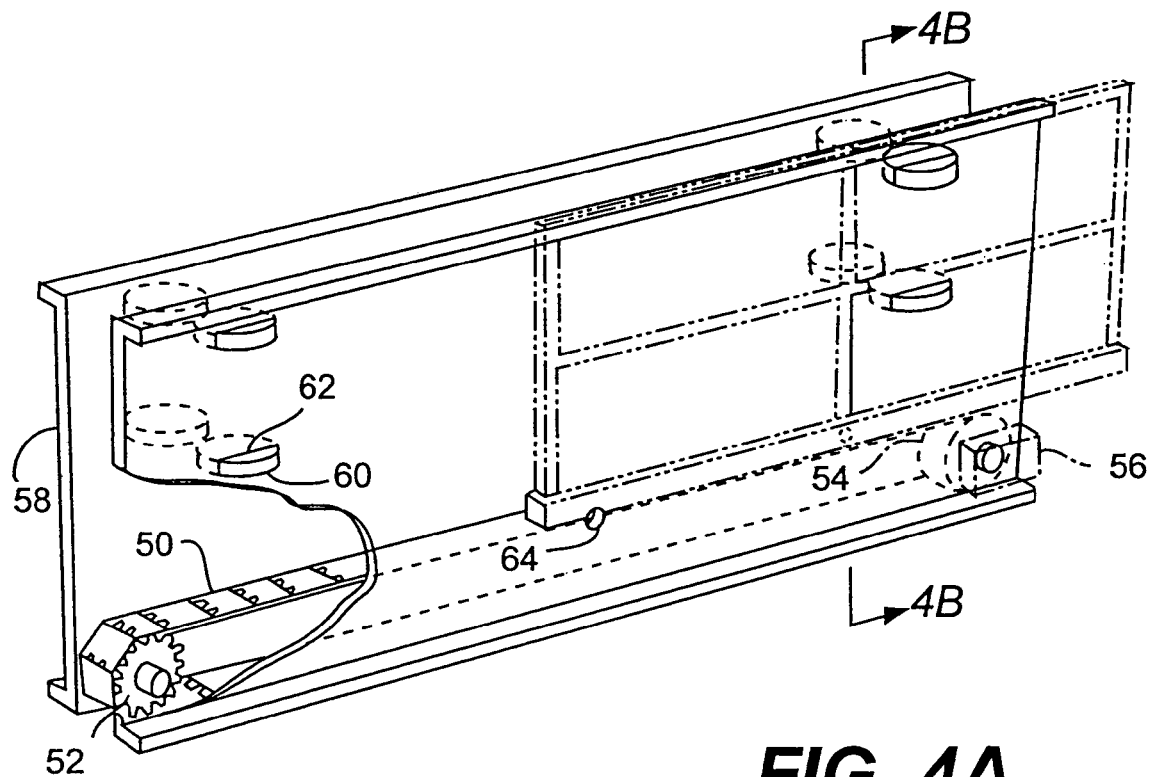
FIG. 4A is a partial perspective view of a lens coating system according to an embodiment of the present invention.
Figure 4B:
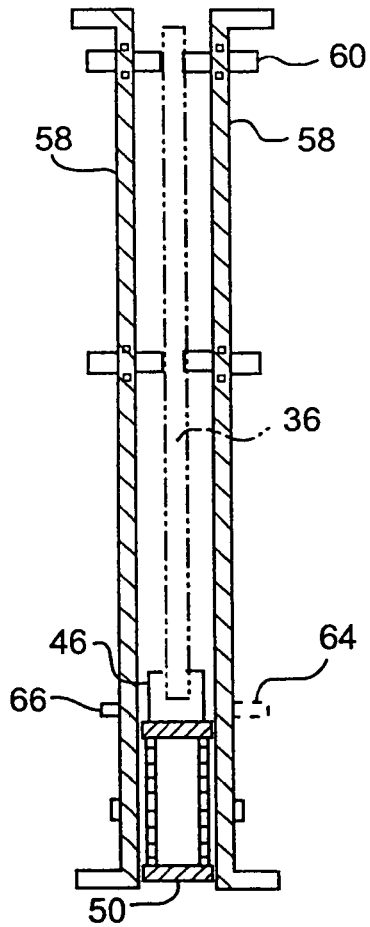
FIG. 4B is a cross-sectional view taken along the line 4B—4B in FIG. 4A.
Figure 4C:
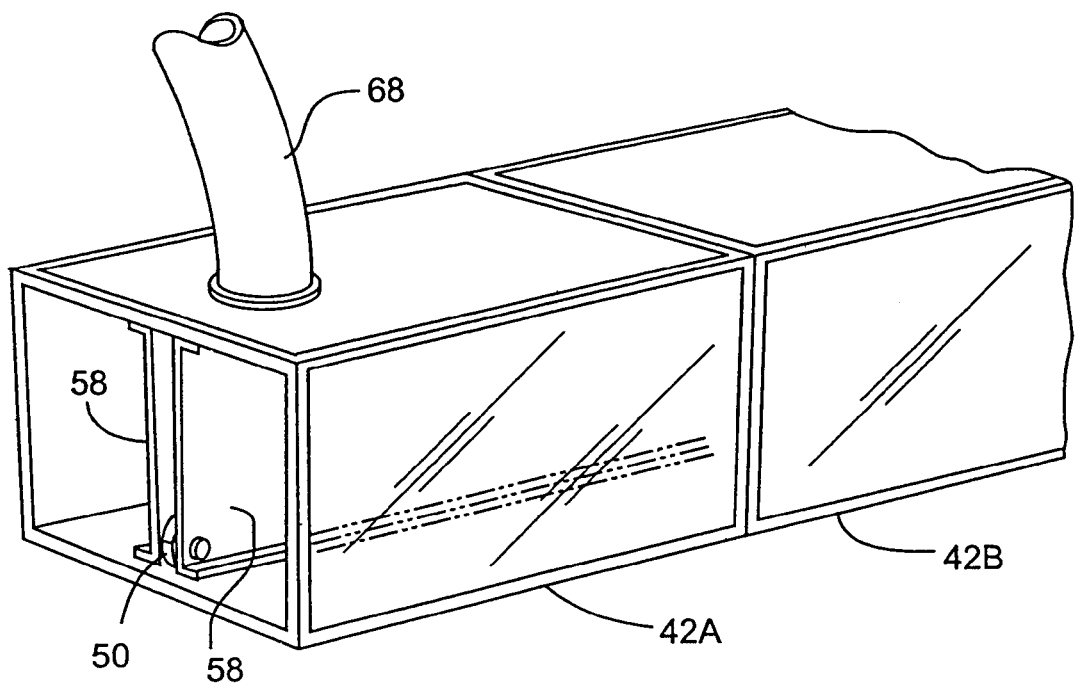
FIG. 4C is a partial perspective view of a lens coating system according to an embodiment of the present invention.

Referring also to FIGS. 2, 4A and 4B, each tray carrier is received in a rectangular slot 44 defined as a "slug" 46. A pair of bolts secures the carrier in the slug. A bore 48 extends through slug 46 beneath the tray carrier. The drying chamber includes a conveyor to transport the slug and carrier (hereinafter referred to collectively as the "carrier" unless otherwise indicated). The conveyor is comprised of individual conveyors in the zones 42A–42E, each extending between opposing wheels 52 and 54. A servo motor 56 drives the conveyor and may be controlled by a personal computer, main frame system or other programmable logic circuit (hereinafter referred to generally as "PLC"). Two side members 58 sit on respective sides of the conveyor, and rollers 60 are disposed in gaps 62 in each side member to guide the tray carrier as it passes between the side members.

A light source 64 mounted in one side member directs light across to the other side member, where it is detected by a light detector 66. The light source and light detector are aligned so that light passes between them through bore 48 in slug 46. Light detector 66 outputs a signal to the PLC which, in turn, controls servo motor 56. Accordingly, the PLC detects the carrier's presence as the slug initially breaks the light beam between source 64 and detector 66 upon entering the first dry zone 42A. Other carrier detection systems may be utilized in lieu of the light detector; for example pressure or contact microswitches may also be employed. When bore 48 reaches the light source/detector pair, detector 66 again detects the light beam, and the PLC stops servo motor 56 for an approximate preprogrammed time say four minutes. At the end of this time, the PLC again activates motor 56 so that the carrier is passed to the second dry zone, 42B. Dry zone 42B has a conveyor, motor and side member pair like that of zone 42A, except that an additional mechanism is included in zone 42B to rotate the side members and conveyor ninety degrees so that the carrier may be passed to zone 42C. In each zone, however, a light source/detector pair is provided to detect the presence of a carrier in the zone. The PLC moves the carrier from one dry zone to the next if no carrier is still waiting in the subsequent zone.

The entrance to zone 42A may be open or may have a suitable covering as appropriate for a given system. A respective duct 68 feeds from a suitable air handling system (not shown) and directs the conditioned air or gas to each dry zone. Suitable ventilation ducts may also be provided. The air conditioning system may be independently controlled to continuously provide properly temperature-controlled and humidified air to the ducts, e.g., at approximately 70° F. +/−2°.

Referring again to FIGS. 3A and 3B, the PLC moves the carrier through a slit valve 72 into an entry lock 70 if the carrier has been in dry zone 42E for a sufficient duration, if no carrier is waiting in entry lock 70, and if suitable conditions exist in entry lock 70 as described in more detail below. Entry lock 70 includes a conveyor 50 and side members 58 as in the dry zones. A light source/detector pair is also provided so that the PLC senses when the carrier is fully within the entry lock. The PLC then stops the servo motor that drives the conveyor and closes the slit valves at the entry lock's entrance and exit to seal the entry lock.

Figure 5A:
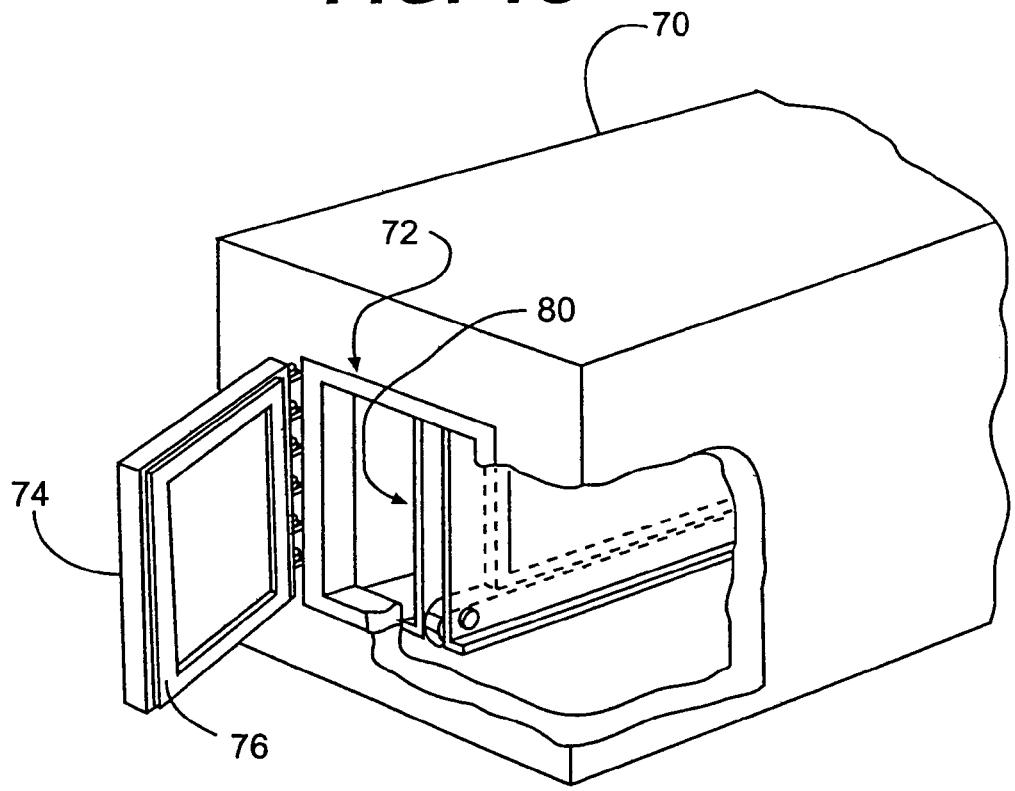
FIG. 5A is a partial perspective view of a lens coating system according to an embodiment of the present invention.

Referring also to FIGS. 5A and 5B, the entrance slit valve 72 includes a door 74 having a sealing material 76 that lines the periphery of its inside surface. Door 74 is hinged so that it is movable by a linkage 78 between an open and closed position. The PLC controls linkage 78. When the door is in its closed position, seal 76 surrounds and seals an entrance passage 80 into entry lock 70.

When the light source/detector in entry lock 70 detects the presence of the carrier through bore 48 (FIG. 2), the PLC closes the slit valves at both ends of entry lock 70. The entry lock is a stainless steel chamber with which inlets, outlets and sensors may communicate as discussed below. It is a closed chamber except for the slit valves. Thus, when the valves are closed, the entry lock is sealed.

When the carrier is in the entry lock, and the chamber is sealed, the PLC activates a valve 82 and a pump 84 to pump out the entry lock and thereby create a vacuum condition therein. Specifically, the pump brings the interior area of entry lock 70 from ambient pressure to a desired preset lower pressure, e.g., at or below one mTorr. The PLC monitors the entry lock's pressure by a pressure sensor 85 extending through the entry lock's housing.

It should be understood that while the entry lock housing, as well as the housings of the entry hold, entry buffer, coating, exit buffer, exit hold and exit lock chambers discussed below, may all made of stainless steel, the housings may be made of any suitable material and in any suitable construction. Further, the housings for the five dry zones and of the five exits zones discussed below may be made from a rigid polymer such as polymethylmethacrylate (PMMA), but may also be made from steel or other suitable material.

When the PLC is notified from pressure sensor 85 that the interior pressure of entry lock 70 is at or below the preset lower pressure, and that a preset minimum time has lapsed, say 290 seconds, since valve 82 was activated, the PLC opens slit valve 86 between entry lock 70 and an entry hold chamber and activates the conveyors in both the entry lock and the entry hold so that the carrier is moved into the entry hold.

The entry hold also includes vertical side members and a light source/detector pair. When the slug bore 48 (FIG. 2) aligns with the light detector and thereby indicates to the PLC that the carrier is fully in the entry hold, the PLC closes slit valve 86 and a slit valve 90 to seal the entry hold. After closing valve 90, the PLC activates a valve 92 that opens a gas line 94 connected to a source (not shown) of dry gas, e.g., nitrogen, to the interior of entry lock 70. The PLC continues to vent the entry lock with the dry gas until pressure sensor 84 indicates atmospheric pressure in the entry lock. The PLC then opens slit valve 72 so that the entry lock can receive the next carrier.

The gas is "dry" in that it has a low water content, for example less than three ppm. A dry vent gas is preferred to prevent undesired water absorption by the lens cores or the chamber walls. In a preferred embodiment, a single source of dry gas is used to provide the vent gas to line 94 as well as to the vent lines for other chambers downstream from the entry lock. Thus, it should be understood that while the chambers are referred to herein as having "respective" vent sources, this includes a construction where all the vent lines may be fed by the same ultimate source of vent gas. Similarly, while individual vacuum pumps are shown in FIG. 3 and described herein, it should be understood that pumping lines to multiple chambers may communicate with the same source of negative pressure.

Before opening valve 86, the PLC brings entry hold 88 to a pressure less than or equal to the set low pressure by activating a valve 98 that opens the entry hold interior to a vacuum pump 100. When pressure sensors 85 and 102 indicate that the entry lock pressure and the entry hold pressure are equal, +/−5 mT, the PCL opens slit valve 86 to move the carrier into the entry hold.

Despite the prior drying stages, the lens cores may still contain some water. The entry hold therefore acts both as a buffer and a drying stage. Repeated pumping to create vacuum conditions in the entry hold draws water vapor from the chamber's walls, and potentially from lens cores, thereby creating a dry environment. Dry gas is used to vent the chamber through a valve 104 operated by the PLC to maintain this condition. When the carrier enters the entry hold, and the PLC seals the chamber, valve 98 remains open so that pump 100 draws water vapor from the tray carrier, slug and lens cores.

When the PLC determines that when sufficient time has elapsed since closing slit valves 86 and 90, it closes valve 98 and opens a valve 106 between a mass flow controller 108 and the entry hold interior. The mass flow controller, the construction and operation of which should be understood by those skilled in the art, may be controlled independently of the PLC in this embodiment and introduces process gas from a common line 110 into the entry hold.

When pressure sensor 102 indicates that the internal pressure of entry hold 88 is approximately the desired level, the PLC opens slit valve 90 and activates the conveyor motors in the entry hold and in an entry buffer 112 to move the carrier into the entry buffer. Again, the entry buffer includes vertical side members 58 and a light source/detector pair that enables the PLC to determine when the slug bore aligns with the light source and detector, thereby indicating that the carrier is fully within the entry buffer. The PLC then closes slit valve 90 and continues to pump the entry hold through valve 98 until the entry hold reaches the desired preset lower pressure. At that time, provided the other conditions discussed above are also met, the PLC opens the slit valve 86 and moves the next carrier into the entry hold.

The entry buffer helps isolate the downstream coating zone from non-process gasses that might otherwise flow to the coating zones from the entry hold. It also acts as a waiting chamber for a carrier waiting to enter the coating zones. It is maintained at the process pressure through a valve 114 that is controlled by the PLC and that opens the entry buffer to a vacuum pump 116. The PLC monitors pressure in the entry buffer by a pressure sensor 118 and introduces the process gas to the entry buffer through a valve 120 connected to process gas line 110 through a mass flow controller 122. When necessary, the PLC can vent the entry buffer with dry gas through a valve 124.

From the entry buffer, the carrier moves through tandem coating zones 126 and 128. The PLC maintains the coating zones at approximately the process pressure by pressure valves 130 and 132 that expose the coating zone interiors to the vacuum pumps 133 and 134. The PLC provides process gas to the coating zones by valves 136 and 138 that are connected to process gas line 110 through mass flow controllers 140 and 142. While a single valve/mass flow controller is shown in this embodiment for each coating zone, it should be understood that a respective such pair may be provided for the front half and the back half of each chamber to independently control the flow of gas to each half. If necessary, the PLC can vent the coating zones with dry gas through valves 144 and 146. The PLC monitors pressure in the coating zones through pressure sensors 148/149 and 150/151.

An exit buffer 152 follows the second coating zone 128. As with the entry buffer and the coating zones, it includes a conveyor and servo motor that may be operated by the PLC. It also includes vertical members 58 and a light source and detector pair. The PLC maintains the process pressure level in the exit buffer through a valve 154 opening to a vacuum pump 156. The PLC monitors pressure in the exit buffer through a pressure sensor 158 and controls the flow of process gas from line 110 into the exit buffer from a mass flow controller 160 by a valve 162.

There are no slit valves between entry buffer 112 and first coating zone 126, between first coating zone 126 and second coating zone 128, or between second coating zone 128 and exit buffer 152. Instead, several steel shoulders 164 extend partially laterally into the system to create a channel extending from the entry buffer through the two coating zones to the exit buffer. Thus, the entry buffer chamber, coating zones and exit buffer chamber define a segmented common chamber. As noted above, the PLC maintains this common chamber at the process pressure, and maintains process gas in the chamber, during the system's operation through respective valves and mass flow controllers. Because of the selective pressurization and depressurization of the entry hold discussed above, and of the exit hold discussed below, the system may coat lens cores on successive tray carriers without having to pressurize and depressurize the coating zones.

The illustrated coating zones 126 and 128 are identically constructed. For ease of explanation, therefore, only the structure of coating zone 126 is described herein.

Coating zone 126 includes two tandemly arranged magnetrons, each having a pair of opposing electrodes 166 and 168. The use of a magnetron is optional, depending on the application. Referring to the schematic cross-sectional view in FIG. 6A, the coating zone does not include vertical members 58 (FIGS. 4A–4B) that would otherwise interfere with the application of the plasma cloud to the lens cores. The cloud is created by electrodes 166 and 168, which include rectangular titanium plates 170 and 172. Each titanium plate is separated from a respective magnetic device 174 and 176 by four 2 mm–3 mm ceramic buttons 178. Each titanium plate is approximately 50 centimeters high, $\frac{1}{16}$ inches thick and 18 centimeters long.

Each magnetic device 174 and 176 may include an outer metal box, for example made of stainless steel, through which cooling water may be pumped from tubes 180. Referring also to FIG. 6B, the interior of each box includes a rectangular central steel core 182 and a surrounding rectangular steel ring 184. A series of permanent magnets 186 extend between core 182 and ring 184 and are arranged in a north-south pattern as shown in FIG. 6B so that central core 182 is a magnetic "south" pole and outer ring 184 is a magnetic "north" pole. Although the exact opposite can also be employed, i.e., the north/south magnets may be totally reversed. Each permanent magnet is separated from adjacent parallel magnets by an approximately two inch gap. Titanium plates 170 and 172 are driven to the same electric potential by an AC power source 188 through a transformer 190. The strength of the magnets may be varied to control the extent of the plasma by one skilled in the art.

A distance of approximately seven to ten centimeters separates titanium plates 172 and 178. When energized, the plates create a plasma cloud between them as should be understood in the art. The 2 mm–3 mm gap between the titanium plates and their respective magnetic devices is so small, however, that no sufficient plasma occurs there. The magnetic field created by the magnetic devices behind the titanium plates also prevents plasma formation. This creates a predictable, stable and relatively uniform plasma cloud between the plates. While an intensely glowing rectangular plasma area 188 is created immediately in front of each of the titanium plates, a plasma cloud 190 between areas 188 has less plasma definition but more uniformity. Specifically, it is more uniform in the vertical direction. Cloud 190 sits above conveyor 50, and it is therefore through this cloud that the lens cores are moved.

Referring again to FIGS. 3A and 3B, each electrode pair 166/168 includes its own pressure sensor 148/149 and vacuum throttle valve 130. As noted above, each electrode pair may also include its own process gas throttle valve. The PLC constantly monitors the pressure in the area in which each electrode pair is disposed and adjusts valves 130 and 136 accordingly to maintain the processing pressure condition. That is, in one embodiment, the process gas flow rate into the area is constant. Throttle valves 130, however, are set to the processing pressure and, therefore, control the out flow rate to maintain the desired pressure. Thus, the uniform plasma clouds remain consistent from one electrode pair to the next. Further, the process gas inlet from each valve 136 is placed behind one of the electrodes 166 or 168 so that the flow from the process gas line is blocked by the electrodes and does not disturb the plasma cloud. Other gas diversion schemes may be designed that accomplish the same end, but using the electrode pair is a convenient solution.

In one embodiment of the present invention, the process gas is seventy percent methane and thirty percent air (a dry mixture of nitrogen and oxygen). It was been found that including oxygen in the process gas provides highly useful means for maintaining the reaction (plasma) chamber clear of deposits such that the coating zone does not have to be cleaned routinely. As can be appreciated, in a continuous plasma apparatus, it is highly advantageous to utilize a processing gas that prevents or diminishes deposits from accumulating in the coating chamber, especially on the electrodes.

As noted above, coating zones 126 and 128 do not include vertical members or light source/detector pairs. Instead, the PLC runs the servo motors in each zone at a constant speed so that the respective conveyors run continuously at preset desired speed, say five m/sec. Thus, once a carrier is driven onto the conveyor in zone 126 from the conveyor in the entry buffer, it moves continuously through the four magnetrons in the two coating zones.

The PLC begins a timer when the light detector in the entry buffer indicates that a carrier moves from the entry buffer conveyor to the conveyor in the coating zone 126 and sends a subsequent carrier from the entry buffer into the coating zone only upon expiration of this timer. In one preferred embodiment, the length of the timer is three hundred seconds, which provides enough time for the exit buffer to move a downstream carrier to an exit hold chamber 196, thereby preventing carriers from stacking up in the coating zones.

Exit hold 196 is the mirror of the entry hold. The PLC creates a vacuum by a pump 198 through a valve 200. It monitors pressure in the exit hold by a pressure sensor 202 and controls the introduction of process gas from line 110 and a mass flow controller 204 by a valve 206.

When pressure sensor 202 indicates that the exit hold pressure is approximately the coating zone pressure say fifty mTorr, and the light detector in exit buffer 152 indicates that a carrier is present in the exit buffer, the PLC opens a slit valve 208 between the exit buffer and the exit hold and activates the conveyors in the exit hold and exit buffer to transfer the carrier to the exit hold. When the light detector in the exit hold-determines that the transfer is complete, the PLC closes slit valve 208 and a slit valve 210 at the exit hold's downstream end, thereby sealing the exit hold. The PLC then throttles valve 200 to remove the process gas and bring the exit hold to less than or equal to one mTorr, or some other desired vacuum pressure.

An exit lock chamber 197 is downstream from the exit hold. Prior to opening slit valve 210, the PLC pumps the exit lock to a pressure of less than or equal to the set low pressure by throttling a valve 210 controlling the application of a vacuum pump 212 to the exit lock interior. When the PLC determines from pressure sensor 202 and a pressure sensor 214 in the exit lock that the exit hold pressure and the exit lock pressure are approximately equal and at or less than the set low pressure, it opens slit valve 210 and activates the exit hold and exit lock conveyors to move the carrier to the exit lock. At this point, the PLC closes slit valve 210 and a slit valve 216 and vents the exit lock with dry gas by throttling a valve 218 until pressure sensor 214 indicates that the exit lock pressure has reached an ambient level. If the PLC detects an ambient pressure condition in the exit lock and that a carrier is present in the exit lock, it opens slit valve 216 and activates the conveyors in the exit lock and a first exit zone 220A to move the carrier to the exit zone. When a light detector in the exit zone indicates that the carrier has been transferred, the PLC closes slit valve 216 and pumps exit lock 197 back to the set low pressure to receive the next carrier.

The construction of the exit zones 220A–220E is similar to that of dry zones 42A–42E. They may be removed from the final zone 220 manually or by an automatic system so that the now-coated lenses exit in the holders 16 (FIG. 1).

It should be understood that the above discussion presents one or more preferred embodiments of the present invention and that various suitable embodiments may fall within the scope and spirit of the present invention. The embodiments depicted are presented by way of example only and are not intended as limitations upon the present invention, and it should be understood by those of ordinary skill in the art that the present invention is not limited to such embodiments since modifications can be made. Therefore, it is contemplated that any and all such embodiments are included in the present invention as may fall within the literal or equivalent scope of the appended claims.

What is claimed is:

1. A method for treating the surface of optical lenses, said method comprising the steps of:
   (A) providing a plasma coating system comprising a coating chamber including a pair of spaced apart electrodes disposed therein, an entry chamber upstream from the coating chamber, and an exit chamber downstream from the coating chamber, wherein the entry chamber includes an entry hold chamber adjacent to the coating chamber, wherein the exit chamber includes an exit hold chamber adjacent to the coating chamber, wherein each of the coating chamber, the entry hold chamber, and the exit hold chamber, independent of each other, is in communication both with a negative pressure source and with a source of a plasma gas;
   (B) preparing the coating chamber for coating the optical lenses, wherein the step of preparing the coating chamber comprises (i) filling the coating chamber with the plasma gas, (ii) constantly maintaining the plasma gas in the coating chamber at a process pressure by using the negative pressure and plasma gas sources of the coating chamber, and (iii) maintaining a predetermined electric potential at each said electrode so that a plasma cloud of said plasma gas is established between said electrodes;

(C) moving a lens into said entry hold chamber;
(D) sealing and vacuuming the entry hold chamber with the lens for a period of time;
(E) bringing said entry hold chamber to said process pressure by filing it with said plasma gas;
(F) bringing said entry hold chamber into communication with said coating chamber;
(G) moving said first lens from said entry hold chamber into said coating chamber and through said plasma cloud;
(H) introducing said plasma gas into said exit hold chamber until reaching said process pressure;
(I) bring the exit hold chamber in communication with the coating chamber;
(J) moving said first lens from said coating chamber to said exit hold chamber,
(K) repeating the steps from step (C) to step (J) for each lens to be treated, wherein the method is characterized in that the coating chamber is not depressurized and pressurized repeatedly.

2. The method as in claim 1, wherein said plasma gas is a polymerizable gas.

3. The method of claim 2, wherein the plasma gas contains oxygen.

4. The method as in claim 1, wherein the entry chamber comprises an entry lock chamber upstream from the entry hold chamber, wherein the entry lock chamber is in communication with but sealable off from the entry hold chamber,
wherein step (C) includes moving said first lens into said entry lock chamber before moving it into the entry hold chamber,
wherein said method includes, following step (C) but before step (D), the steps
(L) bringing said entry lock chamber and said entry hold chamber to a predetermined pressure,
(M) bringing said entry lock chamber into communication with said entry hold chamber and moving said lens from said entry lock chamber into said entry hold chamber, and
(N) sealing said entry hold chamber from said entry lock chamber.

5. The method as in claim 4, wherein said process pressure and said predetermined pressure are unequal.

6. The method of claim 4, wherein the plasma gas contains oxygen.

7. The method as in claim 1, wherein the coating chamber includes a plurality of pairs of spaced apart electrodes, wherein the pairs are tandemly arranged in said coating chamber.

8. The method as in claim 1, wherein
said exit chamber has an exit lock chamber, said exit lock chamber being downstream from and in communication with said exit hold chamber,
said method includes, following step (J), the steps
(L) evacuating said plasma gas from said exit hold chamber,
(M) bringing said exit lock chamber to a pressure equal to the pressure in said exit hold chamber,
(N) bringing said exit hold chamber into communication with said exit lock chamber and moving said lens from said exit hold chamber into said exit lock chamber, and
(O) sealing said exit lock chamber from said exit hold chamber.

9. The method of claim 8, wherein the plasma gas contains oxygen.

10. A method for applying a polymer coating to optical lenses, said method comprising the steps of:
(A) providing said optical lenses on a plurality of carriers;
(B) providing a plasma coating system comprising a coating chamber including a plurality of pairs of spaced apart electrodes disposed in tandem therein, an entry chamber upstream from the coating chamber, and an exit chamber downstream from the coating chamber, wherein the entry chamber includes an entry hold chamber adjacent to the coating chamber and entry lock chamber upstream from the entry lock chamber, wherein the exit chamber includes an exit hold chamber adjacent to the coating chamber, wherein each of the coating chamber, the entry hold chamber, and the exit hold chamber, independent of each other, is in communication both with a negative pressure source and with a source of a plasma gas, wherein the plasma gas is a polymerizable gas;
(C) preparing the coating chamber for coating the optical lenses, wherein the step of preparing the coating chamber comprises (i) filling the coating chamber with the plasma gas, (ii) constantly maintaining the plasma gas in the coating chamber at a process pressure by using the negative pressure and plasma gas sources of the coating chamber, and (iii) maintaining a predetermined electric potential at each said electrode so that a plasma cloud of said plasma gas is established between said electrodes;
(D) moving a carrier with optical lenses into said entry lock chamber;
(E) sealing said entry lock chamber and thereafter bringing said entry lock chamber to a predetermined low pressure;
(F) bringing said entry hold chamber to said predetermined low pressure;
(G) opening said entry hold chamber to said entry lock chamber and moving said carrier from said entry lock chamber into said entry hold chamber;
(H) following step (G), sealing said entry hold chamber from said entry lock chamber, introducing said plasma gas into said entry hold chamber until it reaching process pressure;
(I) following step (G), bringing said entry lock chamber to ambient pressure, bringing another carrier into said entry lock, and repeating said method beginning at step (E) with respect to said another carrier and for a desired number of subsequent carriers;
(J) following step (H), opening said coating chamber to said entry hold chamber and moving said carrier into said coating chamber and through said plasma clouds;
(K) after said carrier is removed from said entry hold chamber in step (J), sealing said entry hold chamber from said coating chamber and said entry lock chamber and returning to step (F) with respect to said another carrier;
(L) following step (J), introducing said plasma gas into said exit hold chamber until reaching said process pressure;
(M) bringing said exit hold chamber to said process pressure; and
(Q) moving said carrier from said coating chamber to said exit hold chamber,
wherein the method is characterized in that the coating chamber is not depressurized and pressurized repeatedly.

11. The method of claim 10, wherein the plasma gas contains oxygen.

12. A continuous method for treating the surface of optical lenses, said method comprising the steps of:
  (A) providing said optical lenses in batches,
  (B) providing a plasma coating system comprising a coating chamber including a pair of spaced apart electrodes disposed therein, an entry chamber upstream from the coating chamber, and an exit chamber downstream from the coating chamber, wherein the entry chamber includes an entry hold chamber adjacent to the coating chamber, wherein the exit chamber includes an exit hold chamber adjacent to the coating chamber, wherein each of the coating chamber, the entry hold chamber, and the exit hold chamber, independent of each other, is in communication both with a negative pressure source and with a source of a plasma gas, wherein the entry hold chamber and the exit hold chamber, independently of each other are sealable from other chambers, and
  (C) selectively depressurizing and pressurizing the entry hold chamber and the exit hold chamber with the plasma gas before bring them in communication with the coating chamber while continuously maintaining the plasma gas in a coating chamber at a process pressure between said batches without depressurizing and pressurizing repeatedly the coating chamber, maintaining a plasma gas in said coating chamber,
wherein said plasma gas is produced from a process gas containing oxygen.

* * * * *